(12) United States Patent
Johnson et al.

(10) Patent No.: US 8,648,636 B2
(45) Date of Patent: Feb. 11, 2014

(54) DELAYING DATA SIGNALS

(71) Applicant: Lattice Semiconductor Corporation, Hillsboro, OR (US)

(72) Inventors: Phillip Johnson, Hellertown, PA (US); Richard Booth, Riegelsville, PA (US); Paulius Mosinkis, Richlandtown, PA (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 0 days.

(21) Appl. No.: 13/892,948

(22) Filed: May 13, 2013

(65) Prior Publication Data
US 2013/0249717 A1 Sep. 26, 2013

Related U.S. Application Data

(63) Continuation of application No. 12/813,573, filed on Jun. 11, 2010, now Pat. No. 8,441,292.

(51) Int. Cl.
*H03L 7/00* (2006.01)

(52) U.S. Cl.
USPC .......................................... 327/161

(58) Field of Classification Search
USPC .......................................... 327/161
See application file for complete search history.

(56) References Cited

U.S. PATENT DOCUMENTS

| 7,454,537 | B1 | 11/2008 | Xue |
| 7,486,752 | B1 | 2/2009 | Kwasniewski |
| 2011/0099407 | A1* | 4/2011 | Jonas ........................ 713/400 |

* cited by examiner

*Primary Examiner* — Daniel Rojas

(57) ABSTRACT

In one embodiment, multiple (serializer-deserializer) SERDES channels are aligned by selectively slipping one or more of the incoming serial data streams one bit at a time prior to deserialization. Within each SERDES channel, a slip circuit slips the corresponding serial data stream by one bit (i.e., one unit interval (UI)) by extending the high portion of the duty cycle of a corresponding clock signal. The high portion of the clock signal is extended using a 3-to-1 mux that selects a fixed high signal, such as the high power supply rail, as an intermediate mux output signal whenever transitioning between two different applied clock signals that are offset from one another by one UI. In this way, the slip circuit avoids glitches that might otherwise result from switching directly between the two clock signals.

16 Claims, 3 Drawing Sheets

100

200

DELAYING DATA SIGNALS

RELATED APPLICATION DATA

This application is a continuation of U.S. application Ser. No. 12/813,573, filed Jun. 11, 2010, now U.S. Pat. No. 8,441,292, which is incorporated herein by reference in its entirety.

BACKGROUND

1. Field of the Invention

The present invention relates to electronics and, more specifically but not exclusively, to circuitry for data synchronization in serializer-deserializer (SERDES) applications.

2. Description of the Related Art

This section introduces aspects that may help facilitate a better understanding of the invention. Accordingly, the statements of this section are to be read in this light and are not to be understood as admissions about what is prior art or what is not prior art.

In an application having multiple SERDES channels, where each SERDES channel converts a different incoming serial data stream into a corresponding set of outgoing parallel data streams, it is often desirable to align the data in time (i.e., synchronize the data) across the multiple, different sets of outgoing parallel data streams. Due to the complexity of the circuitry required to perform such data synchronization on multiple sets of parallel data streams, it is desirable to perform this data synchronization on the data streams in the serial domain before those channels are converted into the parallel domain.

BRIEF DESCRIPTION OF THE DRAWINGS

Other aspects, features, and advantages of the present invention will become more fully apparent from the following detailed description, the appended claims, and the accompanying drawings in which like reference numerals identify similar or identical elements.

DETAILED DESCRIPTION

Figure 1:
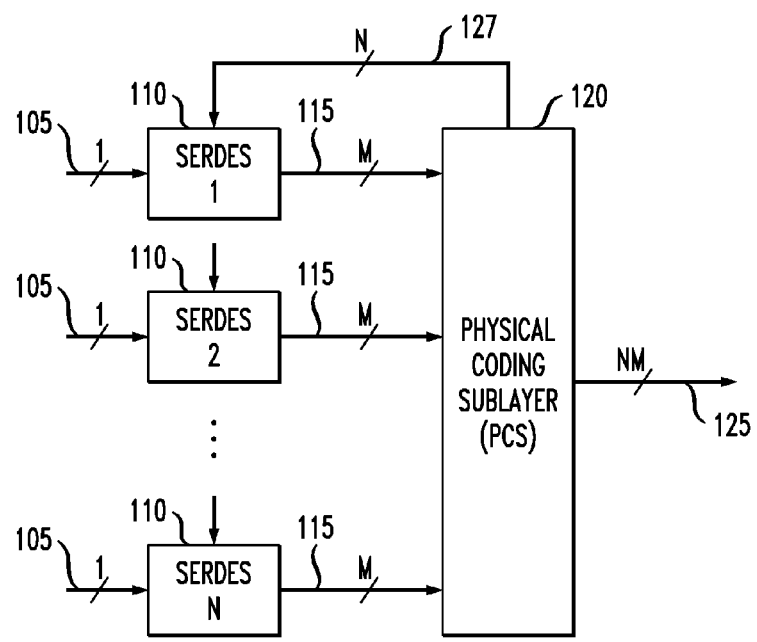
FIG. 1 shows a simplified block diagram of a SERDES system that converts N different, incoming, serial data streams into NM synchronized, outgoing, parallel data streams.

FIG. 1 shows a simplified block diagram of the deserializer data path of a SERDES system 100 that converts N different, incoming, serial data streams 105 into NM synchronized, outgoing, parallel data streams 125, where N and M are both integers greater than 1. In particular, SERDES system 100 has N SERDES circuits 110, each of which converts a different incoming serial data stream 105 into a corresponding set of M parallel data streams 115. Physical coding sublayer (PCS) 120 processes the N different sets of M parallel data streams 115 to form the NM synchronized, outgoing, parallel data streams 125.

To ensure that the NM outgoing data streams 125 are synchronized (i.e., aligned), PCS 120 characterizes misalignment between the N different sets of data streams 115 and generates N different delay control signals 127, one for each SERDES circuit 110. In a typical implementation, during a synchronization tuning phase, a transmitter transmits N copies of the same data sequence via the N serial data streams 105, and PCS 120 determines any misalignments between the different serial data streams by analyzing the corresponding sets of parallel data streams 115. As described in further detail below, each delay control signal 127 instructs its corresponding SERDES circuit 110 whether or not to delay the corresponding incoming serial data stream 105 by one bit before that serial data stream is converted into the corresponding set of parallel data streams 115.

Figure 2:
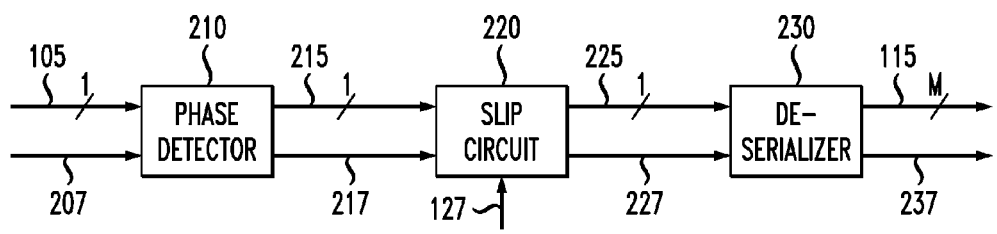
FIG. 2 shows a simplified block diagram of a SERDES circuit that can be used to implement each of the N different SERDES circuits of FIG. 1.

FIG. 2 shows a simplified block diagram of the deserializer data path of a SERDES circuit 200 that can be used to implement each of the N different SERDES circuits 110 of FIG. 1 to convert a corresponding incoming serial data stream 105 into a corresponding set of M outgoing parallel data streams 115.

In particular, SERDES circuit 200 has phase detector 210, slip circuit 220, and deserializer 230. Phase detector 210 aligns applied clock signal 207 to incoming data stream 105 to produce and apply aligned serial data stream 215 and clock signal 217 to slip circuit 220. Slip circuit also receives corresponding delay control signal 127 from PCS 120 of FIG. 1 and, depending on the control information conveyed by delay control signal 127, slips data stream 215 by one unit interval (UI) (e.g., one bit in the serial domain) to produce and apply serial data stream 225 and clock signal 227 to deserializer 230. Deserializer 230 converts serial data stream 225 into the corresponding set of M parallel data streams 115 for application to PCS 120 of FIG. 1.

Note that phase detector 210 may be implemented using any suitable circuitry for aligning data stream 105 and clock signal 207. Similarly, deserializer 230 may be implemented using any suitable circuitry for converting serial data stream 225 into parallel data streams 115. Note further that, depending on the particular implementation, clock signals 207, 217, 227, and 237 may have the same frequency or may have frequencies that are related by integer factors. For example, in one possible implementation, clock signal 217 has the same frequency as clock signal 207, the frequency of clock signal 227 is half that of clock signal 207, and the frequency of clock signal 237 is 1/Mth that of clock signal 207.

Figure 3:
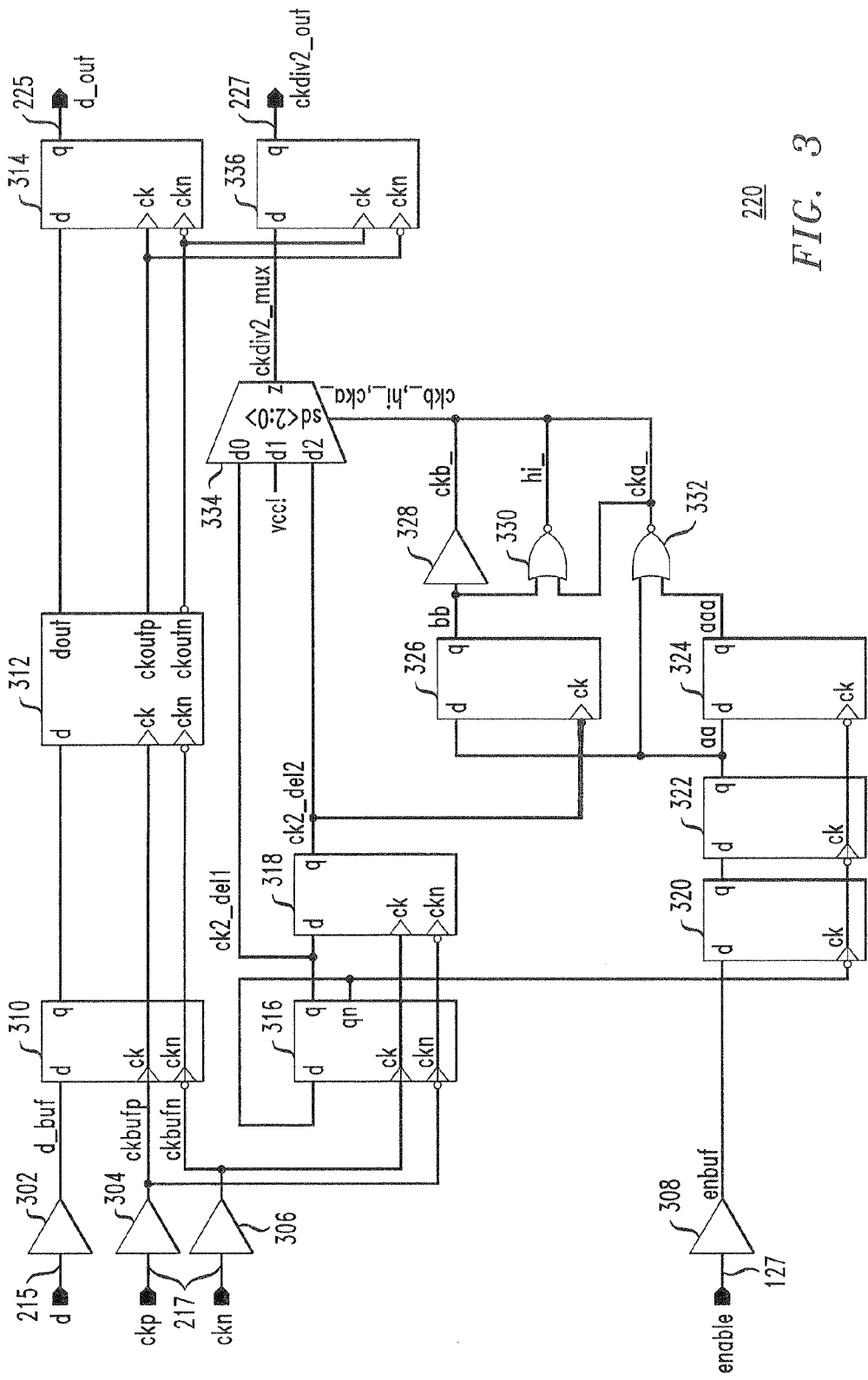
FIG. 3 shows a schematic diagram of the slip circuit of FIG. 2, according to one possible embodiment of the present invention.

FIG. 3 shows a schematic diagram of slip circuit 220 of FIG. 2, according to one possible embodiment of the present invention. As described in further detail below, slip circuit 220 slips (i.e., delays) data stream 215 by 1 UI by adjusting the timing of clock signal 217 relative to outgoing data stream 225 to form clock signal 227, where data stream 225 is a retimed version of incoming data stream 215. In FIG. 3:

- Signal "d" corresponds to incoming serial data stream 215 of FIG. 2;
- Signals "ckp" and "ckn" correspond to the positive and negative sides of incoming differential clock signal 217 of FIG. 2;
- Signal "enable" corresponds to delay control signal 127 of FIGS. 1 and 2;
- Signal "d_out" corresponds to outgoing serial data stream 225 of FIG. 2; and
- Signal "ckdiv2_out" corresponds to outgoing clock signal 227 of FIG. 2.

In slip circuit 220, inverting input buffers 302, 304, 306, and 308 buffer signals d, ckp, ckn, and enable to generate corresponding buffered signals d_buf, ckbufp, ckbufn, and enbuf, respectively. Elements 310, 312, and 314 apply retiming to data signal d_buf to generate outgoing data signal d_out (i.e., serial data stream 225). In particular, flip-flop 310 shifts data signal d_buf by one clock signal to keep the data aligned with the clock, delay match block 312 is used to match the delay of mux 334, and flip-flop 314 is used to match the delay of output clock retiming flip-flop 336.

By applying (i) the positive side ckbufp of the buffered clock signal to the negative clock input (ckn) of flip-flop 316, (ii) the negative side ckbufn of the buffered clock signal to the positive clock input (ck) of flip-flop 316, and (iii) the negative data output (qn) of flip-flop 316 to the data input (d) of flip-flop 316, flip-flop 316 generates at its positive data output (q) an inverted, half-rate version (ck2_del1) of the buffered clock signal. Flip-flop 318 delays (i.e., shifts) clock signal ck2_del1 by half a cycle of clock ckdel1 (which is the same as one cycle of clock signals ck and ckbuf) to generate clock signal ck2_del2.

Flip-flops 320 and 322 apply retiming to control signal enbuf to keep the control signal aligned with the clock and data signals. Negative-edge flip-flops 320, 322, and 324 are driven at their negative clock inputs by the negative version of clock signal ck2_del1, while flip-flop 326 is driven at its positive clock input by clock signal ck2_del2. The positive data outputs from flip-flops 322, 324, and 326 are signals aa, aaa, and bb, respectively.

Signal bb is applied to inverter 328, which generates corresponding inverted signal ckb_. Signals aa and aaa are applied to NOR gate 332, which applies a logical NOR operation to signals aa and aaa to generate signal cka_. Signals bb and cka_ are applied to NOR gate 330, which applies a logical NOR operation to signals bb and cka_ to generate signal hi_.

3-to-1 mux 334 receives (i) three "data" input signals ck2_del1, vcc!, and ck2_del2 and (ii) three "selection control" input signals cka_, hi_, and ckb_ and presents one of the three data input signals as its "data" output signal ckdiv2_mux based on the values of the three selection control signals, where signal vcc! is the voltage of the positive rail of the power supply driving slip circuit 220.

Due to the processing of logic elements 328, 330, and 332, and except for relatively short periods of time resulting from possible slight differences in the timing of the logic elements, one and only one of the three selection control signals cka_, hi_, and ckb_ is high at any given time. When selection control signal cka_ is high (and the other two selection control signals are low), mux 334 presents data input signal ck2_del1 as data output signal ckdiv2_mux. Similarly, when selection control signal hi_ is high (and the other two selection control signals are low), mux 334 presents data input signal vcc! as data output signal ckdiv2_mux. Lastly, when selection control signal ckb_ is high (and the other two selection control signals are low), mux 334 presents data input signal ck2_del2 as data output signal ckdiv2_mux.

Figure 4:
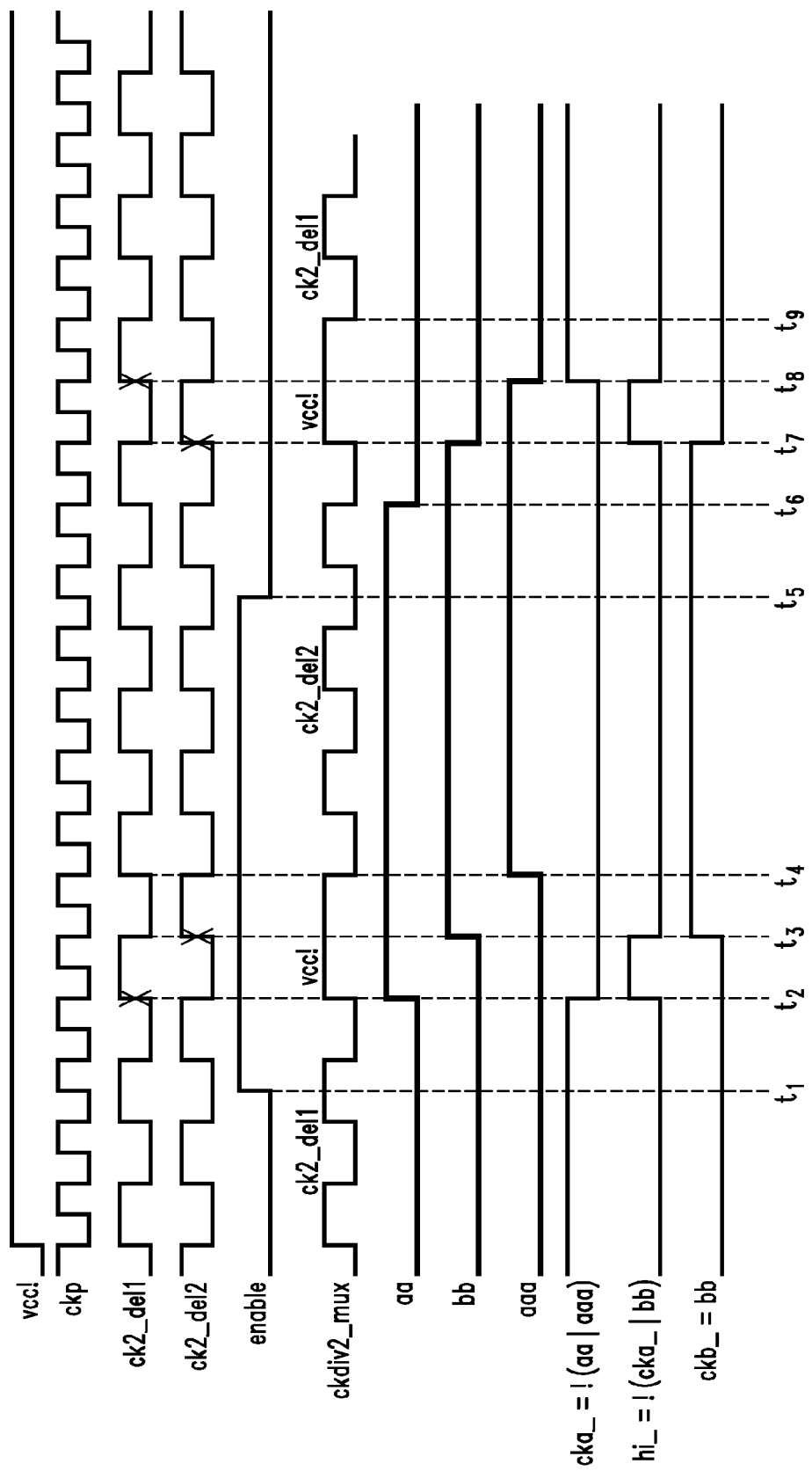
FIG. 4 shows a timing diagram representing the relative timing of some of the signals of the slip circuit of FIG. 3.

FIG. 4 shows a timing diagram representing the relative timing of some of the signals of slip circuit 220 of FIG. 3 for a particular sequence of values in delay control signal 127 (i.e., "enable" in FIG. 3). As represented in FIG. 4, when delay control signal 127 enable goes high (e.g., from 0 to 1) at time $t_1$, the processing of logic elements 328, 330, and 332 and mux 334 eventually results in clock signal ckdiv2_mux staying high for an additional half cycle (between times $t_2$ and $t_4$). This half cycle of half-rate clock signal ckdiv_mux corresponds to one UI of data signals 215 and 225. Keeping clock signal ckdiv_mux high for one UI is equivalent to delaying the corresponding data signal by one UI.

In particular, prior to delay control signal enable going high at time $t_1$, signals aa, aaa, and bb are all low, which results in selection control signal cka_ being high and the other two selection control signals hi_ and ckb_ being low. With selection control signal cka_ high, mux 334 presents clock signal ck2_del1 as clock signal ckdiv2_mux.

After delay control signal enable goes high at time $t_1$, signal aa goes high at the next rising edge of clock signal ck_del1 (time $t_2$), which causes selection control signal cka_ to go low and selection control signal hi_ to go high. With selection control signal hi_ high, mux 334 presents signal vcc! as clock signal ckdiv2_mux. At the next rising edge of clock signal ck2_del2 (time $t_3$), signal bb goes high, which causes selection control signal hi_ to go low and selection control signal ckb_ to go high. With selection control signal ckb_ high, mux 334 presents clock signal ck2_del2 as clock signal ckdiv2_mux. At the next rising edge of clock signal ck2_del1 (time $t_4$), signal aaa goes high, but that does not result in any of the selection control signals changing value. As long as delay control signal enable stays high (i.e., until time $t_5$), selection control signal ckb_ remains high, and mux 334 continues to present clock signal ck2_del2 as clock signal ckdiv2_mux.

If, instead of using a 3-to-1 mux with signal hi_ being one of the three selection control signals and signal vcc! being one of the three data input signals, a 2-to-1 mux were used in slip circuit 220 with clock signals ck2_del1 and ck2_del2 as the two data input signals and signals cka_ and ckb_ as the two selection control signals, then glitches (i.e., undesired transients) could occur in clock signal ckdiv2_mux due to the fact that signal transitions are never perfectly instantaneous and perfectly synchronized. The purpose of using 3-to-1 mux 334 of FIG. 3 is to avoid those glitches. In particular, slip circuit 220 is designed such that mux 334 selects the signal vcc! as an intermediate mux output signal whenever transitioning between the selection of ck2_del1 as the mux output signal and the selection of ck2_del2 as the mux output signal. This intermediate selection of signal vcc! ensures that the high portion of the clock duty cycle is extended by one UI without a glitch (in this case, without any momentary drop in the clock signal around time $t_3$ between the two halves of the extended high portion of the clock cycle).

Referring again to FIG. 4, when delay control signal enable goes low (e.g., from 1 to 0) at time $t_5$, the processing of logic elements 328, 330, and 332 and mux 334 eventually results in clock signal ckdiv2_mux staying high for another additional half cycle (between times $t_7$ and $t_9$). Here, too, this represents another delay of the corresponding data signal by one UI.

In particular, immediately prior to delay control signal enable going low at time $t_5$, signals aa, aaa, and bb are all high, which results in selection control signal ckb_ being high and the other two selection control signals hi_ and cka_ being low. With selection control signal ckb_ high, mux 334 presents clock signal ck2_del2 as clock signal ckdiv2_mux.

After delay control signal enable goes low at time $t_5$, signal aa goes low at the next rising edge of clock signal ck_del1 (time $t_6$), but that does not result in any of the selection control signals changing value. At the next rising edge of clock signal ck2_del2 (time $t_7$), signal bb goes low, which causes selection control signal ckb_ to go low and selection control signal hi_ to go high. With selection control signal hi_ high, mux 334 presents signal vcc! as clock signal ckdiv2_mux. At the next rising edge of clock signal ck2_del1 (time $t_8$), signal aaa goes low, which causes selection control signal hi_ to go low and selection control signal cka_ to go high. With selection control signal cka_ high, mux 334 presents clock signal ck2_del1 as clock signal ckdiv2_mux. As long as delay control signal enable stays low, selection control signal cka_ remains high, and mux 334 continues to present clock signal ck2_del1 as clock signal ckdiv2_mux.

Here, too, the intermediate selection of signal vcc! between the selection of clock signal ck2_del2 and the selection of clock signal ck2_del1 ensures that the high portion of clock signal ckdiv2_mux is extended by 1 UI without any glitches.

As demonstrated above, for slip circuit 220 of FIG. 3, every transition of delay control signal 127 (i.e., enable), whether from low to high or from high to low, results in another one-UI delay of the corresponding data signal. As such, by selectively controlling the transitions in the N different delay control signals 127, PCS 120 of FIG. 1 can adjust the relative timings of the N different sets of parallel data streams 115 generated by the N different SERDES circuits 110 to achieve any desired alignment between those different sets of streams, including co-alignment, where all N sets of streams are synchronized to one another. Note that, if desired, delay control signals 127 can instead be generated to impose desired nonzero timing offsets between the different sets of streams.

The present invention has been described in the context of slip circuit 220 having a particular configuration of timing elements and logic elements that perform one possible combination of signal retiming and logical processing to produce the desired result of slipping applied data signal 215 by one UI for each transition in delay control signal 127. Those skilled in the art will understand and appreciate that there are many other possible implementations that can achieve similar or analogous results. For example:

- For some implementations, the low portion of the clock duty cycle is extended rather than the high portion. In these implementations, rather than the mux receiving and selecting static high signal vcc! as the intermediate mux output, the mux would receive and select a static low signal, such as a ground signal, as the intermediate mux output;
- For some alternative implementations, the applied data signal is slipped by more than one UI for each transition in delay control signal 127. In such implementations, the logic could be designed to maintain the selection of the intermediate mux output for the multiple number of UIs by which the data signal is to be slipped; and
- For some alternative implementations, the applied data signal is slipped only on rising transitions in delay control signal 127 or only on falling transitions in delay control signal 127.

Although the present invention has been described in the context of an application that aligns multiple SERDES channels, the present invention is not so limited. In general, the present invention can be implemented in any suitable context in which a data signal needs to be delayed in a controlled manner. As a non-limiting example, the present invention can be implemented to word align incoming data streams, whether or not those incoming data streams are to be converted into multiple parallel data streams by a deserializer. As another non-limiting example, the present invention can be implemented in a SERDES application that serializes multiple sets of incoming parallel data streams into a plurality of outgoing serial data streams, where the slip circuits are used to align the outgoing serial data streams.

The present invention may be implemented as (analog, digital, or a hybrid of both analog and digital) circuit based processes, including possible implementation as a single integrated circuit (such as an ASIC or an FPGA), a multi-chip module, a single card, or a multi card circuit pack.

Also for purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements.

Signals and corresponding nodes or ports may be referred to by the same name and are interchangeable for purposes here.

It should be appreciated by those of ordinary skill in the art that any block diagrams herein represent conceptual views of illustrative circuitry embodying the principles of the invention. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

Unless explicitly stated otherwise, each numerical value and range should be interpreted as being approximate as if the word "about" or "approximately" preceded the value of the value or range.

It will be further understood that various changes in the details, materials, and arrangements of the parts which have been described and illustrated in order to explain the nature of this invention may be made by those skilled in the art without departing from the scope of the invention as expressed in the following claims.

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments of the present invention.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

The embodiments covered by the claims in this application are limited to embodiments that (1) are enabled by this specification and (2) correspond to statutory subject matter. Non enabled embodiments and embodiments that correspond to non-statutory subject matter are explicitly disclaimed even if they fall within the scope of the claims.

What is claimed is:

1. A system comprising:
   a plurality of N serializer-deserializer (SERDES) circuits each adapted to convert an incoming, serial data stream into an outgoing, M-bit parallel data stream, each SERDES circuit also receiving a corresponding clock signal for clocking the serial data stream; and a processing circuit coupled to the SERDES circuits and adapted to receive the N outgoing, M-bit parallel data streams and combine them into an NM-bit parallel data stream, the processing circuit further adapted to provide a delay control signal to at least one of the SERDES circuits, wherein the at least one SERDES circuit includes a bit slip circuit responsive to the delay control signal for delaying the received clock signal a unit interval (UI) and thereby the corresponding serial data stream a UI before conversion of the serial data stream into the M-bit parallel data stream.

2. The system of claim 1, wherein the at least one SERDES circuit comprises:

a phase detector adapted to align the incoming, serial data stream to the received clock signal;

the bit slip circuit coupled to receive the aligned serial data stream and clock signal from the phase detector and the delay control signal from the processing circuit; and a deserializer coupled to receive the serial data stream and clock signal from the bit slip circuit and adapted to convert the serial data stream into the M-bit parallel data stream.

3. The system of claim 1, wherein the processing circuit comprises a physical coding sublayer (PCS) circuit.

4. The system of claim 1, wherein the bit slip circuit comprises:

first circuitry (e.g., 302, 310, 312, 314) adapted to process the incoming, serial data stream to generate an outgoing, serial data stream (e.g., 225);

second circuitry (e.g., 304, 306, 316, 318) adapted to generate a first clock signal (e.g., ck2_del1) and a second clock signal (e.g., ck2_del2) based on the received clock signal;

third circuitry (e.g., 308, 320, 322, 324, 326, 328, 330, 332) adapted to process the delay control signal (e.g., 127) to generate a plurality of selection control signals (e.g., cka_, hi_, ckb_);

fourth circuitry (e.g., 334) adapted to receive (i) a plurality of input signals including the first and second clock signals and (ii) the plurality of selection control signals and to present one of the input signals as an output signal (e.g., ckdiv2_mux) from the fourth circuitry based on the selection control signals; and fifth circuitry (e.g., 336) adapted to generate an outgoing clock signal based on the received clock signal and the output signal from the fourth circuitry.

5. The system of claim 4, wherein the fourth circuitry is a 3-to-1 mux configured to:

receive (i) three mux input signals including the first and second clock signals and a third mux input signal (e.g., vcc!) and (ii) three selection control signals; and present one of the three mux input signals as a mux output signal (e.g., ckdiv2_mux) to the fifth circuitry based on the three selection control signals.

6. The system of claim 5, wherein the third circuitry is configured to generate the three selection control signals to cause the mux to select the third mux input signal as the mux output signal when transitioning between selection of the first clock signal by the mux and selection of the second clock signal by the mux to prevent glitches in the mux output signal.

7. The system of claim 5, wherein one and only one selection control signal is enabled at a time.

8. The system of claim 5, wherein the third mux input signal has a static signal level.

9. The system of claim 5, wherein the third mux input signal is a power supply voltage level.

10. The system of claim 4, wherein:

the first and second clock signals are half-rate versions of the received clock signal; and the second clock signal is a delayed version of the first clock signal.

11. A method of generating a NM-bit parallel data stream from a plurality of N serial data streams comprising:

receiving N serial data streams;

converting each of the N serial data streams into a respective M-bit parallel data stream;

combining the M-bit parallel data streams into an NM-bit parallel data stream;

detecting that at least one of the M-bit parallel data streams is misaligned with the NM-bit parallel data stream; and for the detected M-bit parallel data stream, delaying the conversion of the corresponding N serial data stream into the M-bit parallel data stream one or more unit intervals (UI) until the M-bit parallel data stream is aligned with the NM-bit parallel data stream.

12. The method of claim 11, wherein:

detecting that at least two of the M-bit parallel data streams are misaligned with the NM-bit parallel data stream; and for each of the detected M-bit parallel data streams, delaying the conversion of the corresponding N serial data stream into the M-bit parallel data stream one or more unit intervals (UI) until the M-bit parallel data stream is aligned with the NM-bit parallel data stream.

13. The method of claim 11 including receiving a clock signal with the serial data stream for clocking the serial data stream, wherein delaying the conversion of the corresponding N serial data stream into the M-bit parallel data stream comprises delaying the clock signal a UI and thereby the corresponding serial data stream a UI.

14. A method of synchronizing data provided by a plurality of serializer-deserializer (SERDES) circuits comprising:

converting a serial data stream received by each of N SERDES circuits into a respective M-bit parallel data stream;

combining the M-bit parallel data streams into an NM-bit parallel data stream;

detecting that at least one of the M-bit parallel data streams is misaligned with the NM-bit parallel data stream;

for the detected M-bit parallel data stream, signaling the corresponding SERDES circuit to delay the conversion of the corresponding serial data stream into the M-bit parallel data stream; and delaying the conversion of the corresponding serial data stream into the M-bit parallel data stream one or more unit intervals (UI) until the M-bit parallel data stream is aligned with the NM-bit parallel data stream.

15. The method of claim 14, wherein:

detecting that at least two of the M-bit parallel data streams are misaligned with the NM-bit parallel data stream; and for each of the detected M-bit parallel data streams, signaling the corresponding SERDES circuit to delay the conversion of the corresponding serial data stream into the M-bit parallel data stream one or more unit intervals (UI) until the M-bit parallel data stream is aligned with the NM-bit parallel data stream.

16. The method of claim 14, wherein each SERDES circuit also receives a clock signal with the serial data stream for clocking the serial data stream; and delaying the conversion of the corresponding serial data stream into the M-bit parallel data stream comprises delaying the clock signal a UI and thereby the corresponding serial data stream a UI.

* * * * *